(12) United States Patent
Siprak et al.

(10) Patent No.: US 9,654,108 B2
(45) Date of Patent: May 16, 2017

(54) APPARATUS AND METHOD HAVING REDUCED FLICKER NOISE

(75) Inventors: Domagoj Siprak, Munich (DE); Marc Tiebout, Finkenstein (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 11/972,639

(22) Filed: Jan. 11, 2008

(65) Prior Publication Data

US 2009/0179695 A1   Jul. 16, 2009

(51) Int. Cl.
*H03L 5/00* (2006.01)
*H03K 3/01* (2006.01)
*H03K 19/003* (2006.01)
*H03D 7/14* (2006.01)
*H03B 5/12* (2006.01)

(52) U.S. Cl.
CPC ....... *H03K 19/00361* (2013.01); *H03B 5/124* (2013.01); *H03B 5/1212* (2013.01); *H03B 5/1228* (2013.01); *H03D 7/1441* (2013.01); *H03D 7/1458* (2013.01); *H03B 2200/0088* (2013.01); *H03D 2200/0043* (2013.01); *H03D 2200/0084* (2013.01)

(58) Field of Classification Search
CPC ........... H03K 3/356; H03K 19/018521; H03K 19/00315; H03K 17/102; H03K 3/012; H03K 19/00381; H02M 3/07; H02M 2003/077; H02M 2003/075; H02M 2001/0041; H02M 2001/0032; H03B 5/1212
USPC ............ 327/544, 306, 333, 534–540; 331/57
See application file for complete search history.

(56) References Cited

U.S. PATENT DOCUMENTS

| | | | | |
|---|---|---|---|---|
| 5,959,488 A | * | 9/1999 | Lin et al. | 327/313 |
| 6,028,450 A | * | 2/2000 | Nance | 326/81 |
| 6,127,892 A | * | 10/2000 | Komurasaki | H01L 27/088 |
| | | | | 257/E27.06 |
| 6,218,892 B1 | | 4/2001 | Soumyanath | |
| 6,225,852 B1 | * | 5/2001 | Cleveland et al. | 327/534 |
| 6,291,857 B1 | * | 9/2001 | Hirano | 257/350 |
| 6,329,684 B1 | * | 12/2001 | Parekh et al. | 257/309 |
| 6,404,243 B1 | * | 6/2002 | Koch et al. | 327/107 |

(Continued)

FOREIGN PATENT DOCUMENTS

WO   WO 2006011364   2/2006

OTHER PUBLICATIONS

Namkyu Park, Body Bias Dependence of 1 / f Noise in NMOS Transistors from Deep-Subthreshold to Strong Inversion, IEEE Transactions on Electron Devices; vol. 48, No. 5, May 2001, pp. 999-1001.

(Continued)

*Primary Examiner* — Dinh T Le
(74) *Attorney, Agent, or Firm* — Schwegman Lundberg & Woessner, P.A.

(57) ABSTRACT

One embodiment described is an apparatus that includes an active device structured in a semiconductor body. The semiconductor body may include a gate terminal to receive a switched bias signal, and a bulk terminal to receive a forward body-bias signal. A first circuit portion may be coupled to the gate terminal to provide the switched bias signal, and a second circuit portion may be coupled to the bulk terminal to provide the forward body-bias signal.

23 Claims, 14 Drawing Sheets

(56) References Cited

U.S. PATENT DOCUMENTS

| | | | |
|---|---|---|---|
| 6,661,272 B2* | 12/2003 | Kim et al. | 327/291 |
| 6,965,253 B1* | 11/2005 | Chen et al. | 326/81 |
| 7,265,582 B2* | 9/2007 | Hsu et al. | 326/68 |
| 7,368,976 B2* | 5/2008 | Gupta et al. | 327/534 |
| 7,382,206 B2* | 6/2008 | Park et al. | 331/182 |
| 7,449,973 B2* | 11/2008 | Yu | 331/185 |
| 7,477,495 B2* | 1/2009 | Dornbusch | 361/56 |
| 7,711,347 B2* | 5/2010 | Kwon et al. | 455/333 |
| 2007/0046386 A1 | 3/2007 | Yu | |
| 2007/0176634 A1 | 8/2007 | Brederlow et al. | |
| 2009/0002084 A1 | 1/2009 | Inoue | |
| 2010/0066438 A1* | 3/2010 | Siprak | H01L 21/761 327/535 |

OTHER PUBLICATIONS

M. Jamal Deen and Ognian Marinov, Effect of Forward and Reverse Substrate Biasing on Low-Frequency Noise in Silicon PMOSFETs, IEEE Transactions on Electron Devices; vol. 49, No. 3, Mar. 2002, pp. 409-413.

Ying-Che Tseng et al. "Device Design Methodology to Optimize Low-Frequency Noise in Advanced SOI CMOS Technology for RF IC's", Dec. 6, 1998.

\* cited by examiner

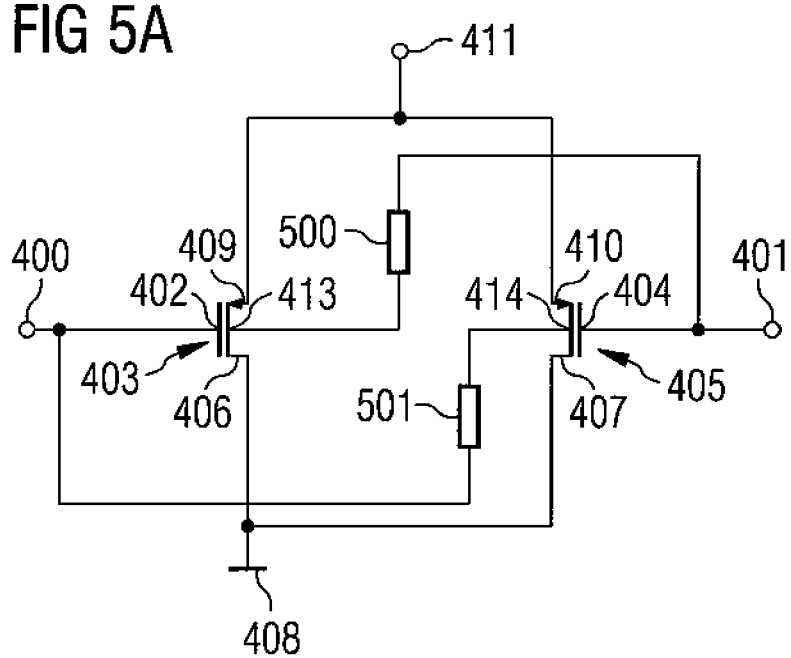
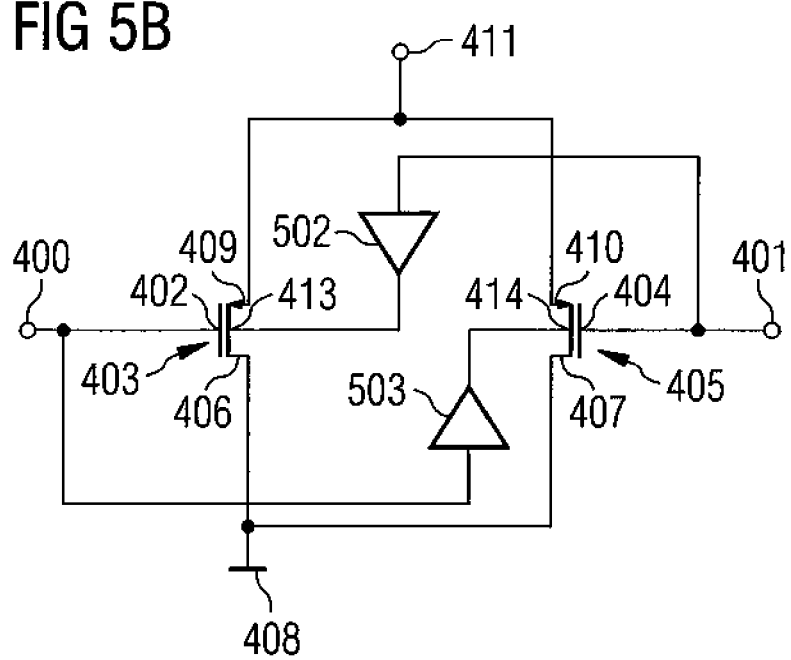

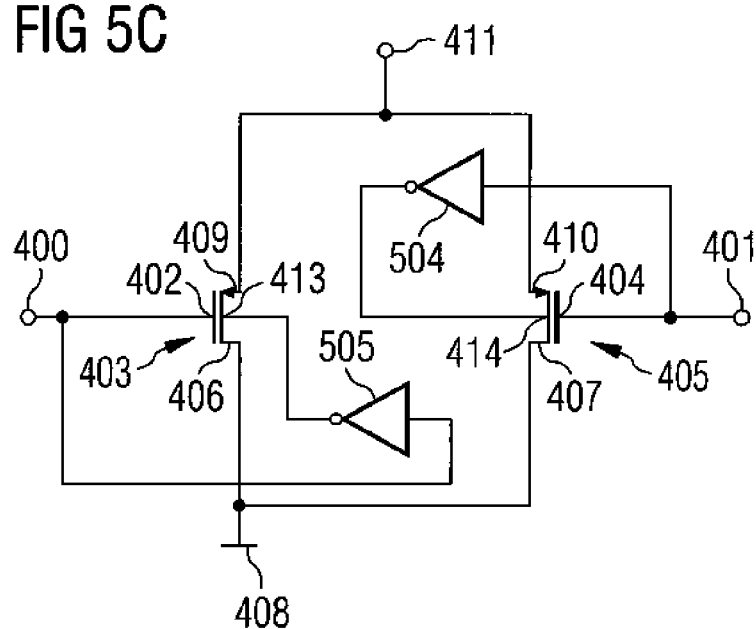
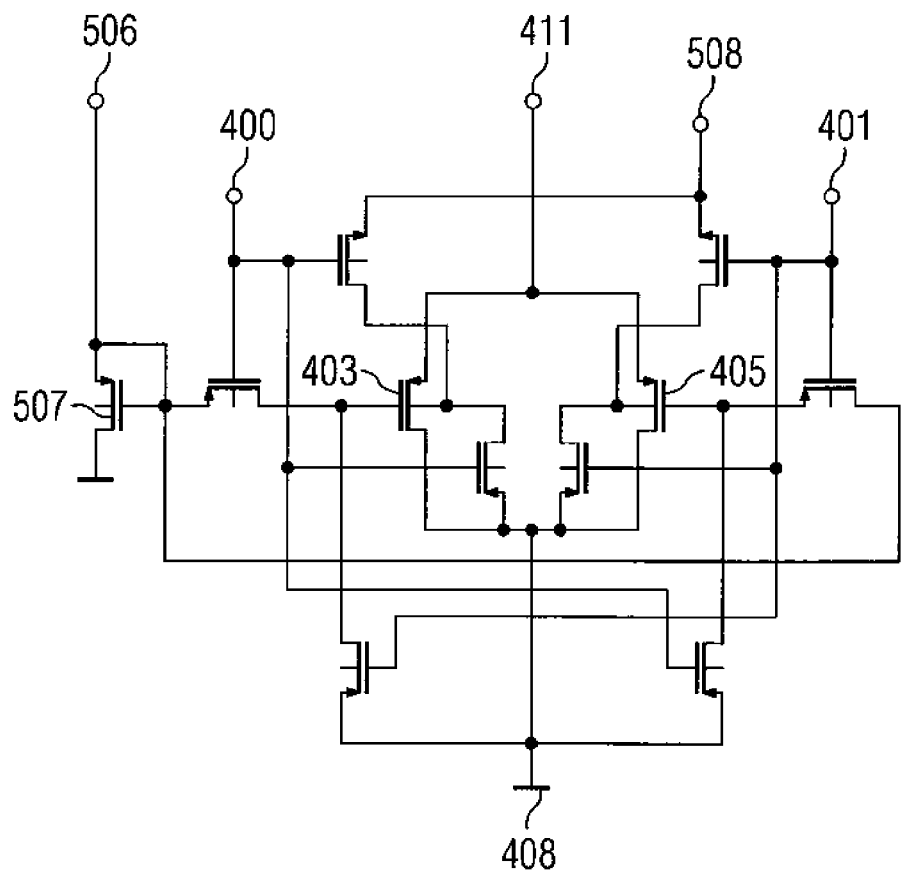

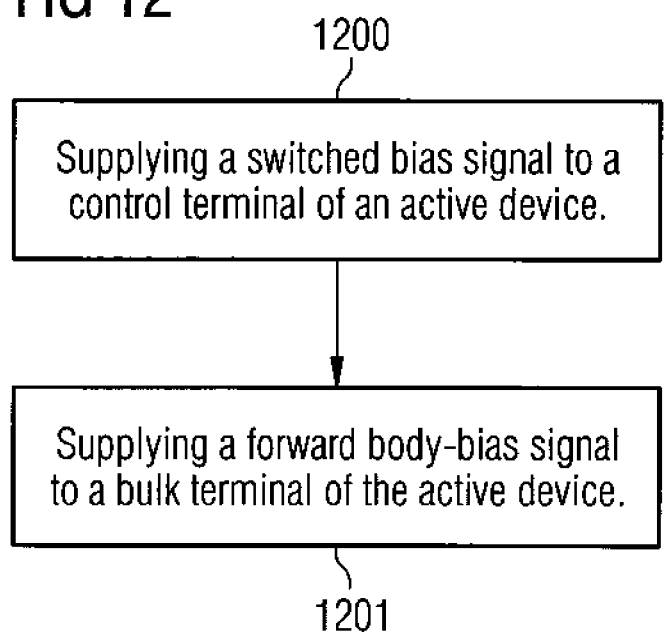

APPARATUS AND METHOD HAVING REDUCED FLICKER NOISE

BACKGROUND

In electronic signal processing, it is usually required to process a signal having low or high signal amplitude. The processing of a signal having low signal amplitude is limited by a noise spectrum. There are diverse sources generating noise, external sources as well as sources caused by effects intrinsic to an apparatus performing the signal processing. One particular noise term in semiconductor devices is so-called "flicker noise", that is also known as "1/f-noise". A close related low-frequency noise source to flicker noise is noise called random telegraph signals. In the following disclosure, the term "flicker noise" is used for low-frequency noise like 1/f-noise or noise due to random telegraph signals.

As indicated by its later denotation, 1/f-noise is most problematic in a low frequency spectral region. Additionally, flicker noise deteriorates the performance of non-linear circuits, e.g. having low frequency flicker noise being mixed and/or translated to higher frequencies in devices, such as frequency mixers, and controlled oscillators.

In battery-driven circuits, where signal-to-noise ratio may be improved at the cost of a higher power consumption, a reduction of flicker noise is desired. In large volume applications, where signal-to-noise ratio may be improved at the cost of a higher larger circuit area, a reduction of flicker noise is desired as well.

According to conventional design methods in semiconductor circuits, flicker noise is widely considered a limiting effect to signal processing.

BRIEF DESCRIPTION OF THE DRAWINGS

The detailed description is described with reference to the accompanying figures. In the figures the left-most digit(s) of a reference number identifies the figure in which the reference number first appears. The use of the same reference number in different instances in the description and the figures may identify similar or identical items.

FIG. 5a shows a second implementation of a current source with reduced flicker noise.

FIG. 5b shows a third implementation of a current source with reduced flicker noise.

FIG. 5c shows a third implementation of a current source with reduced flicker noise.

FIG. 5d shows a third implementation of a current source with reduced flicker noise.

FIG. 12 shows an implementation of a process of signal processing with reduced flicker noise.

DETAILED DESCRIPTION OF THE INVENTION

Disclosed herein are improved techniques for signal processing having a reduced flicker noise that may be used, for example, in semiconductor devices. Techniques in accordance with the present disclosure may advantageously improve performance and reliability of such devices by improving noise behavior and reducing current consumption.

In general, techniques for signal processing having a reduced flicker noise taught by the present disclosure may use an active device receiving a switched bias signal and a forward body-bias signal.

DEFINITION OF TERMS

With reference to a MOS transistor, the term "switched bias signal" may generally refer to a switched voltage between gate and source terminals of the transistor. The voltage switches between a first voltage and a second voltage. The first voltage is equal or larger than a transistor threshold voltage, thus driving the transistor in state of inversion ("on-state") with a gate-to-source-voltage. The second voltage is below threshold voltage, the transistor thus reaching the state of weak inversion, depletion, or accumulation ("off-state").

The term "forward body-bias signal" generally refers to a voltage between a substrate, body, or bulk of the transistor, and the source terminal of the transistor. The voltage drives a substrate-to-source-diode section of the transistor in forward direction. The potential of the substrate is thus higher than the potential of the source.

The terms "body-bias", "back bias" and "substrate bias" are used interchangeably.

The term "gate-oxide" refers to any material stack containing dielectric materials that separate a metal gate electrode from the underlying substrate. The dielectric material may be based on silicon dioxide, containing dopants or not. It may as well be based on a high-k material having a higher dielectric constant, like $Al_2O_3$, $GD_2O_3$, $Yb_2O_3$, $Dy_2O_3$, $Nb_2O_5$, $Yb_2O_3$, $La_2O_3$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, HfSiON, $HfZrO_x$, $Al_xZr_{1-x}O_2$, nitrided silicon dioxide or silicon nitride Si3N4, etc.

The term "gate" refers to any electrode material forming a gate, as e.g. doped poly silicon or TiN, TaN or any other metal gates used in high-k metal gate devices (HKMG).

The term "trap" denotes material defects that are able to capture mobile charge from a conducting inversion channel of a MOS transistor or emit charge to a inversion layer and by that changing the charge density in a channel region and so the device current.

The term "asynchronous" used in this document denotes two signals not being correlated to each other.

Exemplary Apparatus

Figure 1:
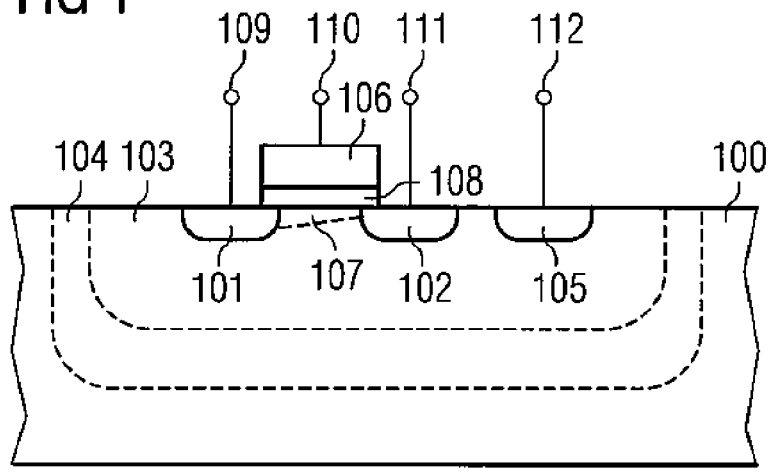
FIG. 1 shows an implementation of an active element formed in a semiconductor body.

FIG. 1 shows an implementation of an active device formed in a semiconductor body. The active device is a field effect transistor formed in a substrate 100 made of a semiconductor material, such as Silicon or Gallium-Arsenide. It is readily understood by one skilled in the art, that any other suitable semiconductor material may be used accordingly. The substrate 100 is p-doped, so to form a field effect transistor of the n-type. The active device has a drain region 101 being an n-doped region. It further has a source region 102 being an n-doped region. The drain region 101 and the source region 102 are arranged within a p-well 103 formed in the substrate 100. The p-well 103 is embedded in an n-well 104, so to isolate the p-well 103 from the remaining substrate 100. A body region 105, being a p-doped region, is arranged in the p-well 103. A gate region 106 is formed at least partly over a channel region 107 between the drain region 101 and the source region 102. A gate-oxide 108 separates the gate region 106 and the channel region 107. A drain terminal 109 connects to the drain region 101. A gate terminal 110 connects to the gate region 106. A source terminal 111 connects to the source region 102. A bulk terminal 112 connects to the body region 105. The exemplary active device thus constitutes a MOSFET transistor of the n-type. Yet, the present disclosure does also encompass the application of the described technique to any other transistor, such as a FET transistor of the p-type, etc.

Figure 2:
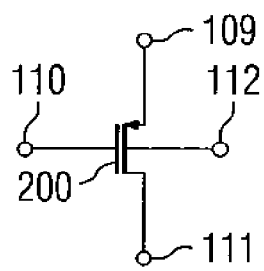
FIG. 2 shows a circuit representation of the active device of FIG. 1.

FIG. 2 shows a circuit representation of the active device of FIG. 1. The active device 200 has a drain terminal 109, a gate terminal 110, a source terminal 111, and a bulk terminal 112.

Figure 3:
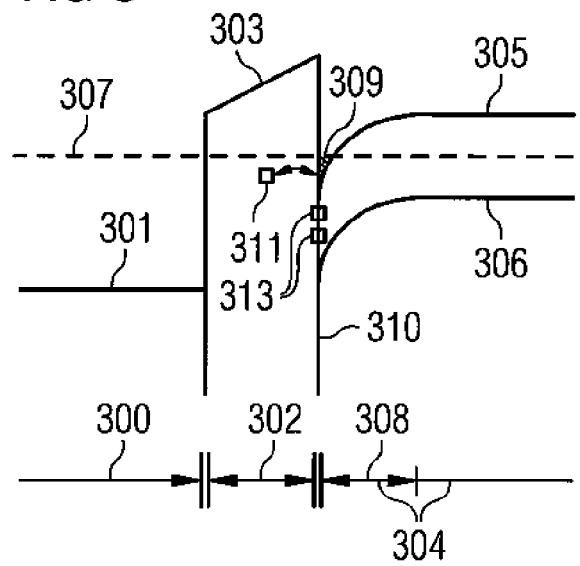
FIG. 3 shows a schematic representation of the band diagram of the active device according to FIG. 1 in inversion.

FIG. 3 shows a schematic representation of the band diagram of the active device according to FIG. 1 in inversion. The active device as shown in FIG. 1 relates to a MOSFET type of transistor. The functioning of a MOSFET is based upon drift transport of majority carriers within the channel region 107. In case of the MOSFET, control of the conductivity of channel region 107 is mainly performed by influencing the carrier density. Thus, an electric potential applied to the gate region 106 controls the property of the channel region 107. A voltage supplied at the gate terminal 110 with reference to a body-bias potential defines the electric potential. The p-well 103 may be formed by a p-silicon substrate.

The Band diagram shows the energy levels in three regions. The first region 300 corresponds to the gate region 106. A first energy level 301 shows the Fermi level of the metal.

A second region 302 corresponds to the gate oxide 108. The gate-oxide 108 has an oxide thickness $d_{OX}$. A second energy level 303 shows the energy distribution in the gate-oxide when a voltage Vgb is applied between gate terminal 110 and the p-well 103 or respectively a voltage $V_{GS}$ between the gate terminal 110 and the source terminal 111. The second energy level 303 has an ascending slope of e. $V_{GS}/d_{OX}$ within the second region 302. The constant e represents the elementary charge of an electron.

A third region 304 corresponds to the p-well 103. A third energy level 305 corresponds to the conductance band of the p-silicon substrate. A fourth energy level 306 corresponds to a valance band of the p-silicon substrate. A fifth energy level 307 corresponds to the Fermi level for electrons in the p-silicon substrate. The first energy level 301 and the fifth energy level 307 are spaced apart by an energy level of e·$V_{GS}$. The voltage $V_{GS}$ represents the gate-source voltage applied to the active device. Due to a positive value of $V_{GS}$, the band bending of the conduction band is high enough to accumulate negative surface charge in an inversion layer 309 of the depletion zone 308 of the third region 304. The depletion zone 308 has a thickness $d_S$ that depends on the doping concentration of p-well. The negative surface charge in the inversion layer 309 forms the channel of the active device. A transport of carriers takes place in the channel.

Traps in the gate-oxide 108 and/or at the interface 310 between the gate-oxide 108 and the p-well 103 give cause to capture of mobile carriers from the channel and emission of captured charge into the channel. By way of example, a charge trap 311 is shown in FIG. 3. The charge trap 311 is located at an energy level similar to the energy level of the inversion layer 309 or below. Carriers of the inversion layer 309, i.e. the channel region 107, may be trapped by the charge trap 311. Traps in the oxide with an energy level in the band gap between conduction band 305 and valence band 306 communicate with the conduction band 305 and the valance band 306 via so-called interface traps 313 residing at the interface between the gate-oxide 108 and the p-well 103. The charging and de-charging rate of the charge trap 311 may depend on various factors, such as:

capture cross section of the charge trap 311, emission cross sections of the charge trap 311 influenced by the density of states of the band structure where captured charge wants to tunnel to, energy of the charge trap 311 with respect to the Fermi level, and distance of charge trap 311 to the interface 310, etc.

Trapped charges will furthermore influence charge in the channel region 107 by changing channel charge density via the potential influence of the trapped charge and mobility by acting as a scattering center for mobile channel charge. Both effects lead to a change in current of the transistor. The influence depends on the distance of the charge trap 311 to the interface 310.

Flicker noise in a semiconductor device is caused by charging and de-charging the charge trap 310, which leads to fluctuations in the drain current of the transistor. The oscillation of carriers between the charge trap 311 and the inversion layer 309 give raise to noise of signals transmitted via the channel region 107. Since the oscillation is at a relative low rate the noise is most dominant at low frequencies, though it is noticeable up to frequencies around 100 MHz. With scaling of transistor structures, flicker noise will become noticeable at even higher frequencies. Flicker noise deteriorates the performance of active devices in analogue and/or radio frequency systems. The effect becomes even more important, since modern technologies, having nitrided gate-oxides or high-k gate dielectrics, showing higher flicker noise compared to pure silicon dioxide. Technology scaling towards smaller semiconductor devices increases local statistical mismatch variations of flicker noise. Reduced gate length of scaled technologies additionally increases flicker noise.

The technique described in the present disclosure makes use of the finding, that flicker noise may be significantly reduced by a combination of a switched bias condition and a positive back-biasing, i.e. applying a forward body-bias signal to the p-well 103. Applying a switched bias condition shifts the energy level of the charge trap 311 and the bands at the gate-oxide-to-p-well interface where trapped charge may tunnel to, alternating below and above the Fermi level. Together with the bands also the energy levels of the interface traps 313 are shifted. Energy levels above the Fermi level for electrons are empty and below are filled (within a certain energy distribution width for clear empty to clear filled state). Changing the gate voltage to a negative potential with respect to the p-well accumulates a high concentration of holes and empties interfaces states. The positive p-well forward body back-biasing signal establishes this potential for a gate to source voltage of zero volts. Interface states communicate very fast with the valance (and conduction) band 305 (306). Thus, during the transistor off state the positive p-well forward body back-bias signal establishes a situation that reduces strongly the trap emission time for emptying a charged trap 311. The charge trapped in the charge trap 311 may be emptied by tunnelling to the conduction band 305 and recombine via interface traps 313 with the accumulated holes in the valence band 306 or by tunnelling directly to an interface trap 313 at the same energy level and recombine with the accumulated holes in the valence band 306. Switching the gate bias signal for a certain time of while having a forward body bias increases during this time the rate of emptying the charge trap 311 strongly. The effective emission time is a result of the emission time during the on and the off state. If the off emission time is reduced strongly the effective emission time is reduced accordingly. A charge trap 311 filled by a slow capture time and emptied by a fast emission time produces a low noise power density. The main cause of flicker noise is thus suppressed.

It had been further recognized by the inventors, that the application of a forward bias does only give cause to a significant reduction of flicker noise, if the forward body bias is applied during the time when the switched bias drives the active device into its off state.

Furthermore, due to the described mechanism, it may be advantageous to apply the forward bias only, if the transistor is in its off state. A forward body bias may degrade the ratio of transconductance to current gm/Id. So, it Is preferable to have no body forward bias during the on state of the transistor and applying the forward body bias only during the off state of the transistor. To that end, the forward bias may be a switched signal out of phase to the switched bias. It may be derived from the inverse switched bias. The use of a switched forward bias may reduce power consumption of the active device. This technique will be denoted in the following as a switched bias in combination with an alternating back-bias pulsing.

The described technique works for high frequency signals of switched gate bias and switched forward body bias as well, because for a signal with 50% duty cycle the transistor sees 50% of time a situation for a much shorter emptying time then during the other time. The effective emission time is the result of having 50% of the time a short and in the other 50% of time a longer emission time. This results in a reduced emission time compared to constant or not switched bias conditions. The duty cycle must not be 50%, also shorter percentage duration of the condition of transistor off state in combination with a forward body-bias can result in a significant noise reduction. The duty cycle leading to noise reduction is determined by the emission time constants of the trap in the off and in the on state of the transistor. Noise reduction however will only occur for frequencies below the switching frequency in case of a 50% duty cycle and respective frequencies for non 50% duty cycle. Duty cycles with less than 50% of off state may have advantages when a higher average DC transistor current with lower noise wants to be achieved. The short time off state pulses could be filtered more easily. Noise reduction may also be achieved with much lower frequency switching than the actual circuit is operating. In the case of an oscillator phase noise, the switching could be comparatively low to the oscillation frequency because flicker noise, as a low-frequency phenomena, may change the frequency of the oscillator only in a long time scale compared to the period of the oscillator.

The described techniques, using a forward back-bias, i.e. a forward substrate bias, is an appropriate means for noise reduction in semiconductor circuits using scaled technologies. Especially the fact that forward substrate bias is needed only during the transistor off state supports new circuit architectures and biasing schemes in circuits that may allow for different useful application of the described techniques.
Exemplary Current Source Circuits A current source is used in various applications to supply a circuit section with a predetermined current. The noise of the current should be low enough not to deteriorate the signal processing of the circuit section. Noise is problematic, particularly when a signal having small amplitude occurs during signal processing.

Figure 4A:
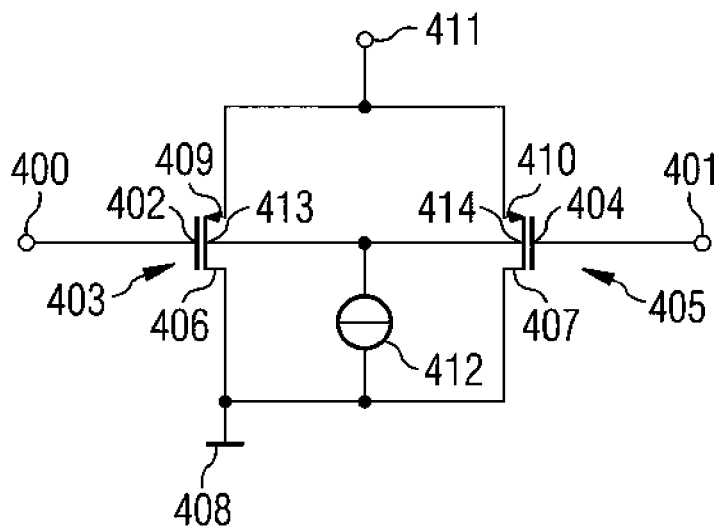
FIG. 4a shows a first implementation of a current source with reduced flicker noise.

FIG. 4a shows a first implementation of a current source with reduced flicker noise. The current source has a first input 400 and a second input 401. It further has a first transistor 403 and a second transistor 404. The first transistor 403 and the second transistor 404 may each be implemented as the active device shown in FIG. 1. Yet, other implementations of the active device may be chosen, e.g. an implementation having no double-well structure. The first transistor 403 may have the same geometrical configuration as the second transistor 404 for a good current matching.

The first input 400 connects to a first gate terminal 402 of the first transistor 403. The second input 401 connects to a second gate terminal 404 of the second transistor 405. A first source terminal 406 of the first transistor 403 and a second source terminal 407 of the second transistor 405 connect to a reference terminal 408. The reference terminal 408 corresponds to a ground termination or receives a constant reference voltage, such as a zero Volt potential. A first drain terminal 409 of the first transistor 403 and a second drain terminal 410 of the second transistor 405 connect to an output 411. A current source 412 connects to a first bulk terminal 413 of the first transistor 403 and to a second bulk terminal 414 of the second transistor 405. The current source 412 provides a current so to supply a forward bias to the first bulk terminal 413 and to the second bulk terminal 414.

Figure 4B:
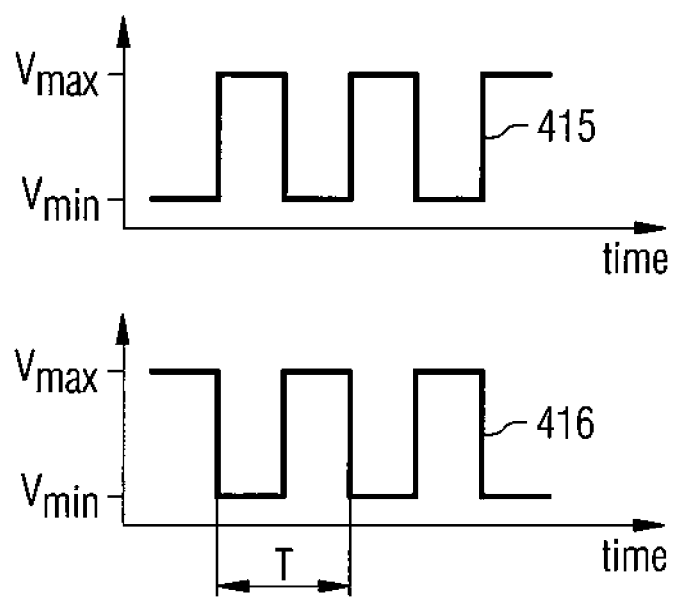
FIG. 4b shows signals applied to inputs of the current source shown in FIG. 5.

The first input 400 and the second input 401 each receive a respective first control signal 415 and second control signal 416, both shown schematically in FIG. 4b. The first control signal 415 and the second control signal are switched signals alternating between at least two different voltage values. FIG. 4b shows exemplary time dependent behavior of the first signal 415 and the second signal 416. Both, the first signal 415 and the second signal 416 alternate between a maximum voltage value $V_{max}$ and a minimum voltage value $V_{min}$. The maximum voltage value $V_{max}$ is a voltage high enough to open the channel region of the first transistor 403 and the second transistor 404. The minimum voltage value $V_{min}$ is a voltage low enough to close the channel region of the first transistor 403 and the second transistor 404. The first signal 415 and the second signal 416 alternate with a given time period T in a stepwise manner. During a first half time period T/2, one of the first signal 415 and the second signal 416 assumes the maximum voltage value $V_{max}$ while the other assumes the minimum voltage value $V_{min}$. During the next half time period T/2, the other assumes the maximum voltage value $V_{max}$ while the one of the first signal 415 and the second signal 416 assumes the minimum voltage value $V_{min}$. Thus, the first signal 415 and the second signal 416 form a periodical, bit-like signal stream supplied to the first input 401 and the second input 401. As a result, the first gate terminal 402 is brought to a high voltage level, while the second gate terminal 414 is brought to a low voltage level and vice versa. If one of the gate terminals is brought to the high voltage level, the respective transistor is brought to a conductive state and assumes an operating point in inversion. If, on the other hand, one of the gate terminals is brought to the low voltage level, the respective transistor turns off, i.e. it assumes an operating point in depletion or accumulation. In consequence, the first transistor 403 and the second transistor 404 provide an output current provided at the output 411.

The first transistor 403 and the second transistor 404 both receive a switched bias signal at the gate terminal. Both receive a constant forward bias signal provided by the current source 412 to the respective bulk terminal. In consequence, the current source provides an output current at its output 411 that shows a reduced flicker noise.

For the reasons given before, the duty cycle of both signals provided to the gates of the two transistors must not be 50%. But, the timing of both signals should may be arranges so that when one transistor is of the other is on.

In general, the technique of a switched bias and constant forward body-bias may be applied to all kind of current sources.

FIG. 5a shows a second implementation of a current source with reduced flicker noise. The second implementation of a current source makes also use of replacing a single transistor as current source by pair of preferably structurally identical replacement transistors. It differs from the first implementation shown in FIG. 4a by the fact, that the current source 412 is omitted. Instead, the first bulk terminal 413 couples via a first load 500 to the second input 401. The second bulk terminal 414 couples to via a second load 501 to the first input 400. As for the first implementation, the first signal 415 and the second signal 416 are applied to the first input 400 and the second input 401 respectively. The first load 500 and the second load 501 may include a resistor, an inductor, a capacitor and/or a combination thereof. They may as well include an amplifier, a MOSFET switch, or any other active device. An amplifier may give an advantage in generating the appropriate value of the body-bias signal instead of deriving the body-bias signal without an amplifier from the gate signal. In general, the loads are disposed to provide a body-bias signal derived from the input signals derived from the input signals. The body-bias signal of one of the transistors is a switching signal asynchronous and/or out-of-phase to the bias signal applied to the same transistor.

The first implementation of the current source makes use of a switching bias signal and a constant forward body-biasing. In difference to that, the second implementation makes use of a switching bias signal and a switching forward body-biasing. By that, flicker noise may be reduced while allowing for a power saving architecture of the current source.

FIG. 5b shows a third implementation of a current source with reduced flicker noise.

The current source is arranged in a way, such that the forward body-bias of a transistor is generated via an respective first amplifier 502 or amplifier 503 from the gate signal of the transistor.

FIG. 5c shows a fourth implementation of a current source with reduced flicker noise.

The current source is arranged in a way, such that the forward body-bias of a transistor is generated via an respective first inverting amplifier 504 or second amplifier 505 from the gate signal of the transistor.

FIG. 5d shows a fifth implementation of a current source with reduced flicker noise.

FIG. 5d differs from the first and second implementation by a bias current that is applied to a third input 506. The bias current is mirrored through a current mirror formed by a third transistor 507 and the first transistor 403, resp. the second transistor 405. A plurality of additional transistors assures that asynchronous and/or out-of-phase gate and body-biasing switching signals are applied to the first transistor 403 and the second transistor 405. A terminal 508 provides a forward body-bias signal.

In general, the technique of a switched bias and switched forward body-bias may be applied to all kind of current sources.

Exemplary Oscillator Circuits

An oscillator is an important and useful circuitry to be arranged in semiconductor devices. It may be used in many different applications, such as clock generation. In many RF transceivers, an oscillator is arranged to generate local oscillator signals for up- and/or down-conversion of transmitted or received signals.

Flicker noise dominates the noise properties towards lower frequencies. Yet, since the oscillator is a non-linear circuitry, it generates output signals that are mixed with flicker noise components. Thus, the output signal has a resonator bandwidth, where the up converted flicker noise is shaped. It is therefore useful to reduce flicker noise of components within the oscillator circuitry.

Recently advances in radio-frequency (RF) CMOS technology have opened the extensive use of CMOS for RF circuits. CMOS has replaced bipolar technologies in many RF applications due to its capability for system on chip integration. However, one main limitation of CMOS is the high Flicker noise compared to bipolar devices. Flicker noise limits area and power reduction of RF and analogue circuits, which is especially important for large volume and mobile applications. Methods for 1/f noise reduction are of special interest in CMOS RF and analogue circuit design. Voltage controlled oscillator (VCO) is a key building block of RF transceivers and the VCO phase noise affects strongly the system performance. Close to carrier phase noise is strongly influenced by the Flicker noise of CMOS devices.

Figure 6:
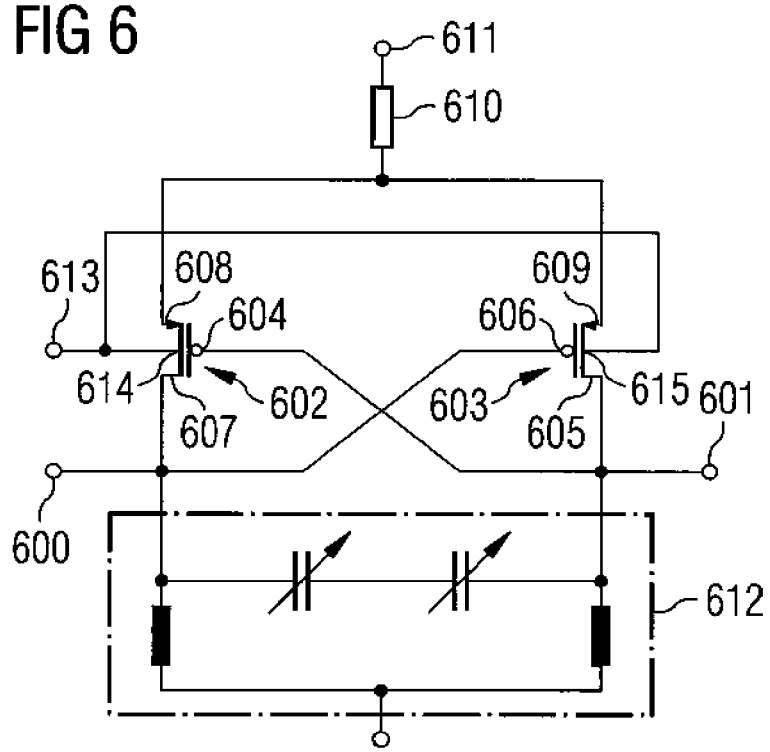
FIG. 6 shows a first implementation of an oscillator with reduced flicker noise.

FIG. 6 shows a first implementation of an oscillator with reduced flicker noise. The oscillator is based on a VCO topology. It has a first output 600 and a second output 601. The oscillator further has a cross coupled pair of a first PMOS transistor 602 and a second PMOS transistor 603 to generate a frequency signal. A first gate terminal 604 of the first PMOS transistor 602 connects to a second drain terminal 605 of the second PMOS transistor 603. A second gate terminal 606 of the second PMOS transistor 603 connects to a first drain terminal 607 of the first PMOS transistor 602. The first drain terminal 607 couples to the first output 600. The second drain terminal 605 couples to the second output 601. A first source terminal 608 of the first PMOS transistor 602 and a second source terminal 609 of the second PMOS transistor 604 couple via a load 610 to a supply voltage terminal 611. The first drain terminal 607 and the second drain terminal 605 further couple to a resonator 612 (shown in dashes lines). The load 610 may include a resistor, an inductor, a capacitor and/or a combination thereof. The load 610 may as well include an amplifier or any other active device.

The resonator 612 is a circuit that generates a signal having a desired frequency in response to a signal provided by the frequency signal generated by the cross coupled pair of the first PMOS transistor 602 and the second PMOS transistor 603. As depicted by way of example in FIG. 6, the resonator 612 may include capacitors and inductors. The resonator elements may be variable in value of capacitance or inductance, so to tune a frequency to a desired value. For that purpose, the resonator 612 may include an array of capacitors and/or inductors. The reactive values of the elements may be changeable. Both, voltage controlled and/or current controlled elements are feasible. E.g., the resonator 612 may include a digitally controllable capacitor. In some embodiments, the resonator 612 may include one or several varactors.

The oscillator further has an input 613, which connects to a first bulk terminal 614 of the first PMOS transistor 602 and to a second bulk terminal 615 of second PMOS transistor 603 for supplying a forward bias current thereto. The forward bias current may be a constant signal or a switched signal. The frequency of the switched signal may relate to a frequency generated by oscillator. A frequency divider may derive the frequency of the switched forward body-bias signal from the frequency generated by the oscillator. In diverse embodiments, the frequency of the switched body-bias signal may be different, e.g. it may be much higher or much lower than a frequency generated by oscillator.

Figure 6A:
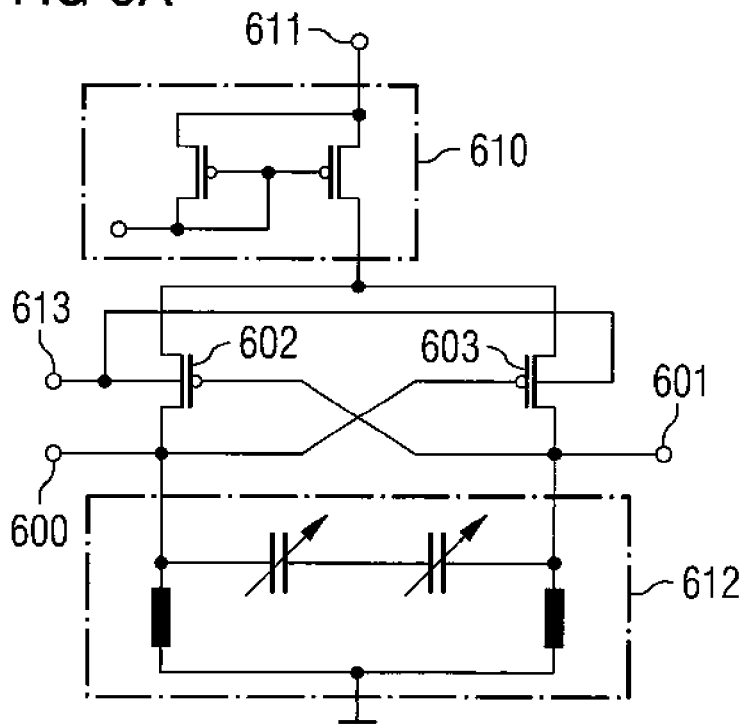
FIG. 6a to FIG. 6d show different modification of an oscillator with reduced flicker noise
Figure 6B:
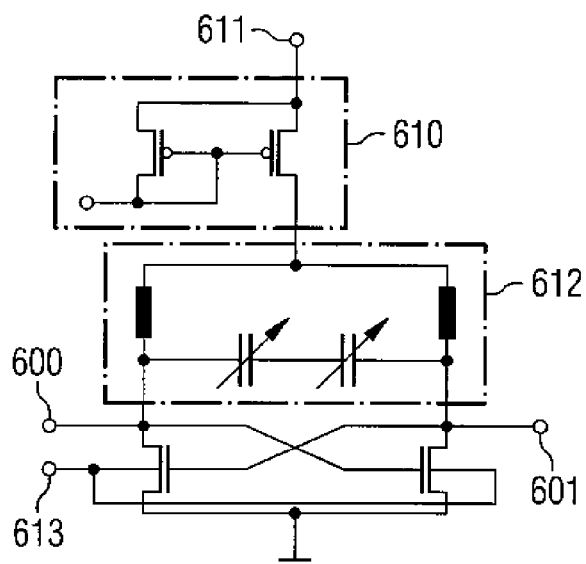
Figure 6C:
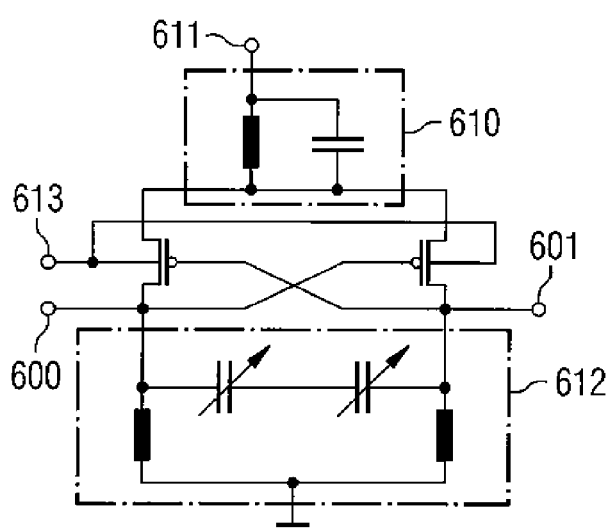
Figure 6D:
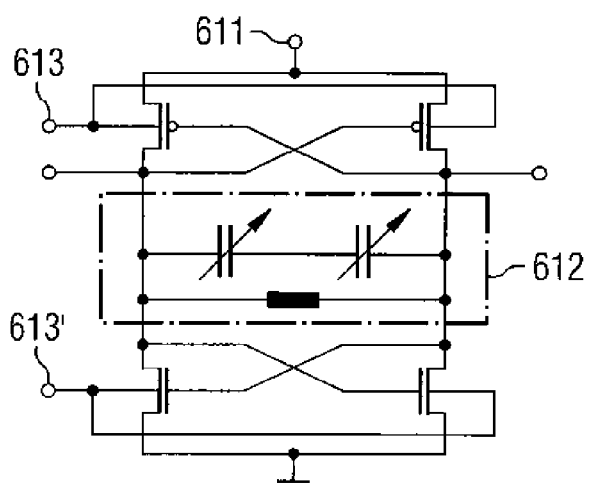

FIGS. 6a to 6d show different modification to the implementation of FIG. 6. As shown in FIG. 6a, the load 610 may be implemented as current mirror to inject a bias current. As shown in FIG. 6b, the oscillator may be mirrored to a pair of cross-coupled n-type transistors. As shown in FIG. 6c, the load 610 may include a matching network including a capacitor and an inductor in parallel. As shown in FIG. 6d, the load 610 may be replaced by an additional pair of cross-coupled transistors that receive a forward bias signal.

All modifications make use of the technique, that a transistor having a switched bias receives a forward body-bias as well. Transistors having a constant bias do not need to receive a forward body-biasing, since reduction of flicker noise will be to low to measure. The forward body-bias signal may be constant or switched. In one embodiment, it may be asynchronously switched to the body-bias. It is as well possible, that the forward body-bias is switched with a frequency much higher that the frequency of the bias signal.

FIG. 7a to FIG. 7d show different modification of a second implementation of an oscillator with reduced flicker noise. The second implementation is based on the oscillator architecture of FIG. 6.

Figure 7A:
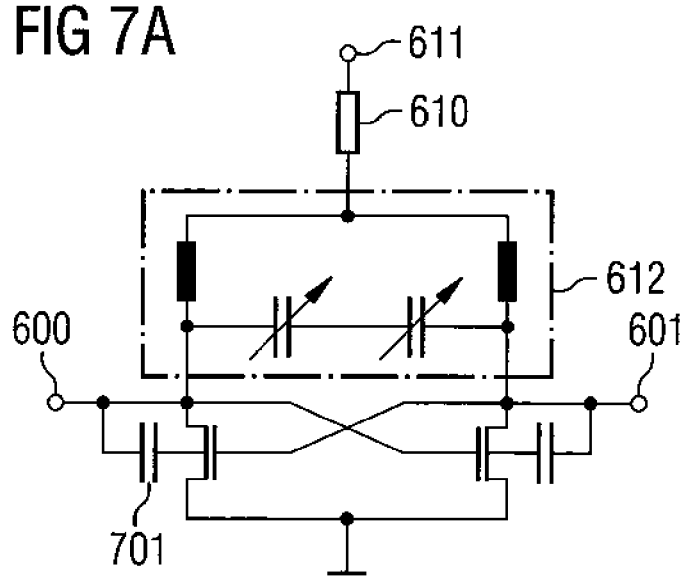
FIG. 7a to FIG. 7d show different modification of a second implementation of an oscillator with reduced flicker noise.
Figure 7B:
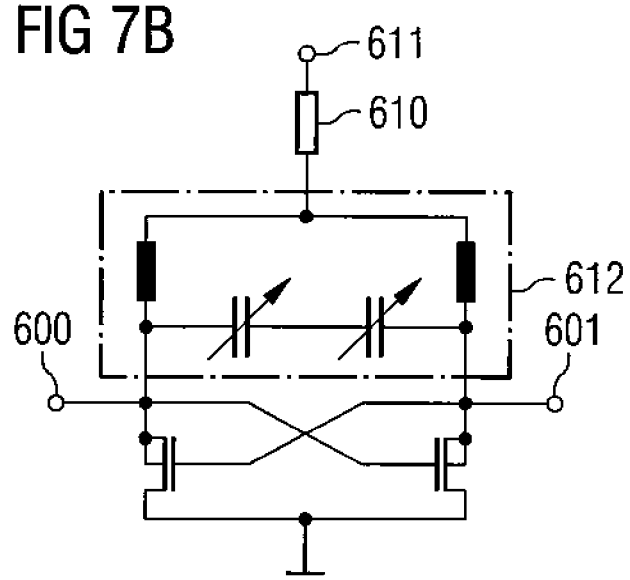
Figure 7C:
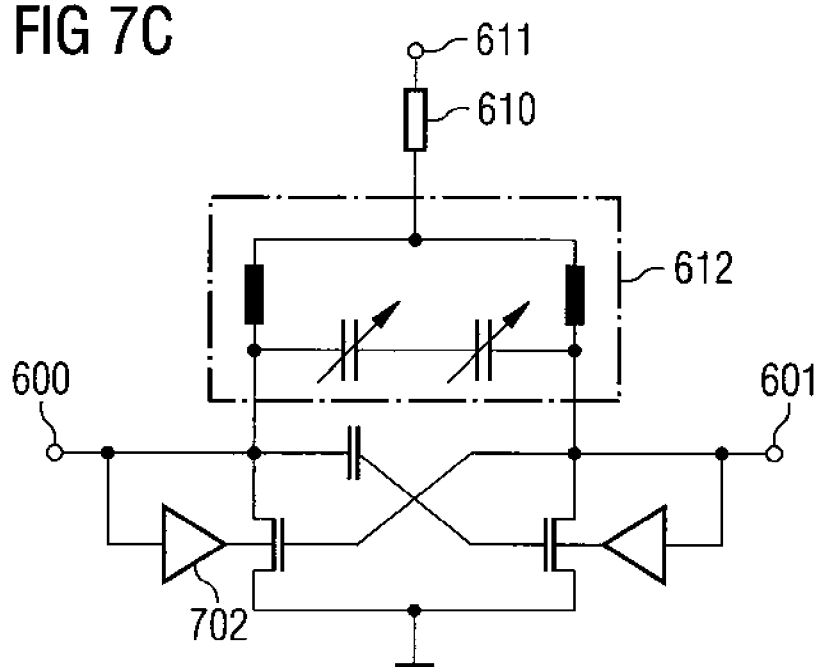

Those modifications have in common, that the cross-coupled transistors receive a switched forward bias. This technique may be also denoted as back-biasing pulsing. To that effect, a bulk terminal of one of the transistors is coupled to one of the first output 600 or second output 601. By that means, the bulk terminal receives a switched signal produced by the oscillator itself. The bulk terminal may either be directly couple to the respective output, as shown in FIG. 7b, or by a passive component, such as a capacitor 701, as shown in FIG. 7a. Yet, the bulk terminal may also couple to the respective output via an active component, such as a buffer and/or amplifier 702, as shown in FIG. 7c.

Figure 7D:
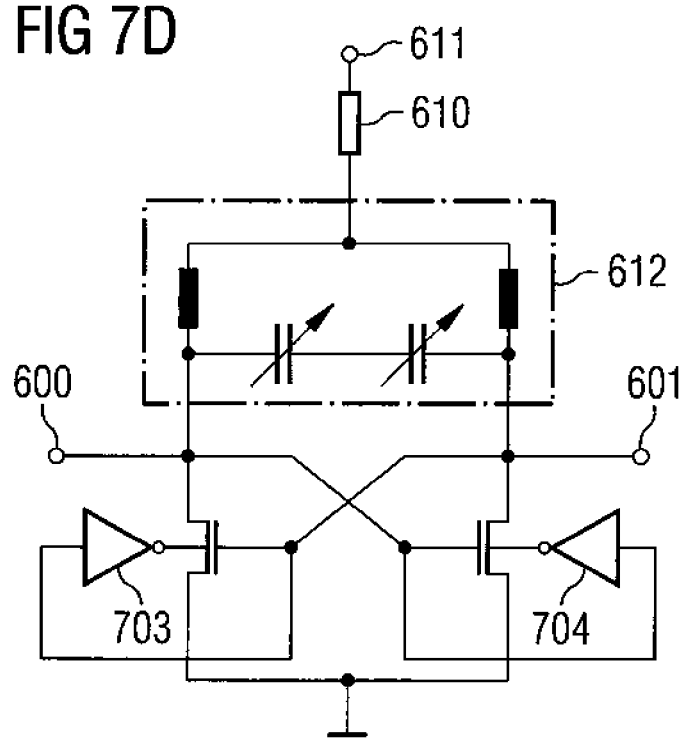

FIG. 7d shows an oscillator where the body-bias in each of the transistors is derived by an inverting amplifier 703 or 704 from its signal at the gate.

Figure 8:
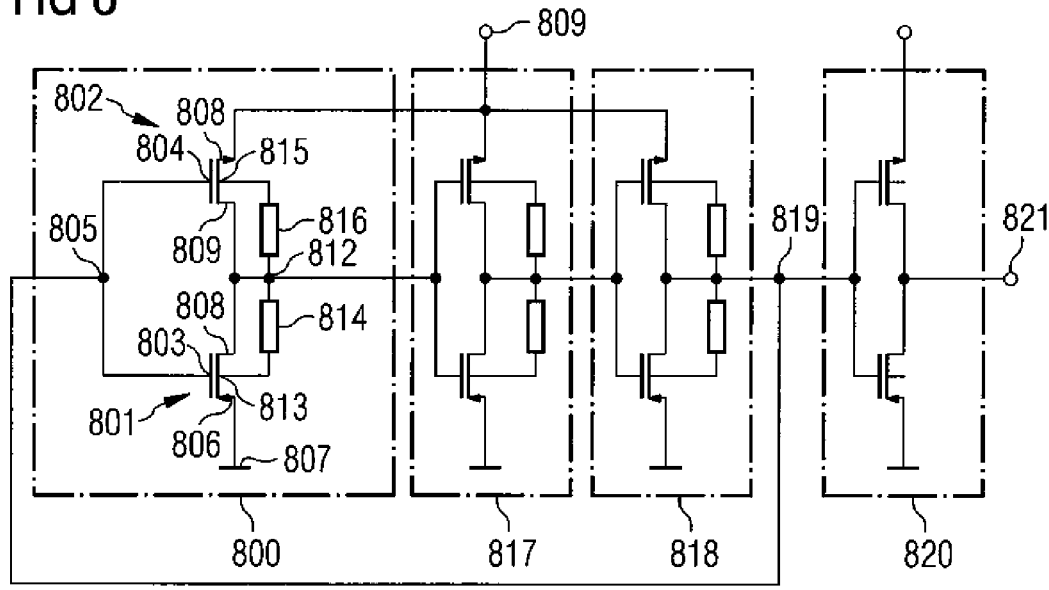
FIG. 8 shows a third implementation of an oscillator with reduced flicker noise.

FIG. 8 shows a third implementation of an oscillator with reduced flicker noise. The third implementation is based on a ring-oscillator topology. A ring-oscillator includes digital components, while the oscillators described so far are based on analogue components. A ring-oscillator includes a plurality of stages, which coupled in series in a ring-wise manner. By way of example, FIG. 8 shows a topology having three stages, though any other suitable number of stages may be arranged. A first stage 800 includes a first transistor 801 and a second transistor 802. A first gate terminal 803 of the first transistor 801 and a second gate terminal 804 of the second transistor 802 couple to a first input knot 805. A first source terminal 806 of the first transistor 801 couples to a terminal 807. Terminal 807 may be a ground terminal or a drain terminal of a transistor as e.g. used in ring oscillators that translate the gate voltage at this transistor into a frequency, e.g. based on an analogue-to-digital converter, by changing the drive current of each inverter stage. A second source terminal 808 of the second transistor 802 couples to a supply voltage terminal 809. A first drain terminal 810 of the first transistor 801 couples to a second drain terminal 811 of the second transistor 802 and to a first output knot 812. The first stage 800 thus forms a common source buffer topology.

In contrast to a known common source buffer, the first stage 800 includes a coupling of the first output knot 812 to a first bulk terminal 813 of the first transistor 801 via a first load 814 and to a second bulk terminal 815 via a second load 816. Thus, the described technique of a switched bias in combination with back-bias pulsing is applied to the first transistor 801 and the second transistor 802.

The first output knot 812 couples to a series of a second stage 817 and a third stage 818. The second stage 817 and the third stage 818 have the same implementation as shown for the first stage 800. Thus, each stage makes use of a switched bias in combination with a back-bias pulsing. A second output knot 819 of the third stage 818 couples to the first input knot 805 to close the ring of the ring-oscillator topology. It further couples via an output buffer 820 to an output 821 of the ring-oscillator. The output buffer 820 may be omitted, yet it arranges for an amplified and rectified version of the oscillator signal.

Techniques using an inverter or an inverting amplifier to derive the body-bias signals from the bias signals are used in various other embodiments.

All shown oscillator circuitry includes active devices receiving a switched bias signal and a forward body-bias signal. The body-bias may be switched. It may as well be out-of-phase and/or asynchronous to the switched bias signal. Thus, the flicker noise in the oscillator circuitry is reduced. Though the disclosure describes only some embodiments, it is readily understood by one skilled in the art, that the same technique and the different variants may be applied to any other oscillator circuitry. In some embodiments, the oscillator circuitry may include a current source having reduced flicker noise, e.g. as shown in FIG. 4a, FIG. 5a, and/or FIG. 5b.

Exemplary Mixer Circuits

A mixer is used to convert a high frequency signal to a low frequency signal and vice versa. Mixers are widely used, e.g. in transceiver units for communication applications. As highly integrated transceivers may use direct conversion techniques for down-conversion, the baseband output of a mixer may start at 0 Hz. The performance loss by flicker noise in mixer circuitry is thus an important contribution to the performance loss caused by noise. Reduction of flicker noise becomes an important issue, especially since a mixer circuit is a non-linear circuitry.

Figure 9:
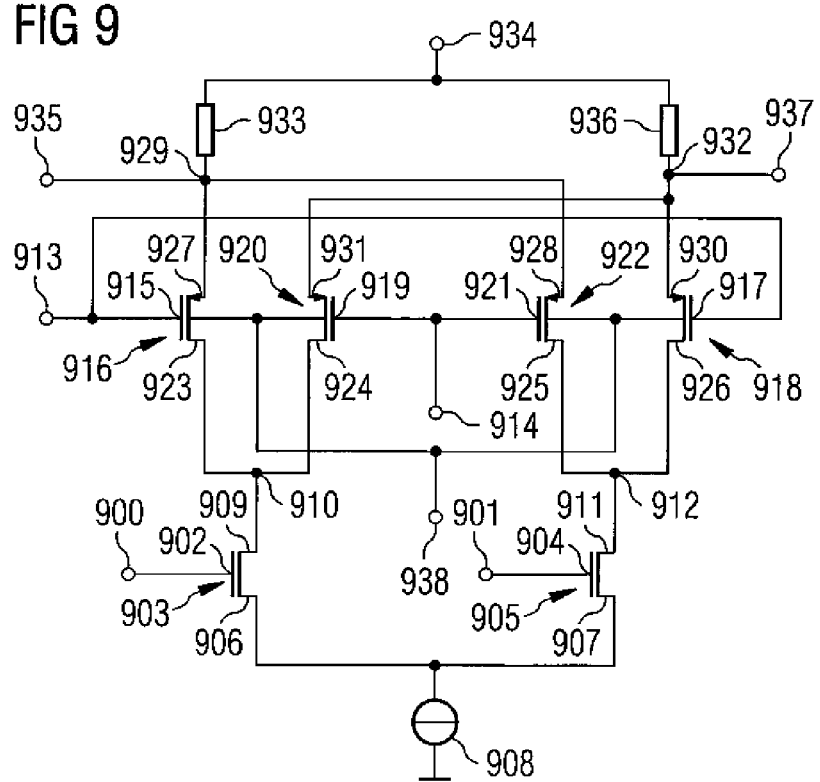
FIG. 9 shows a first implementation of a mixer with reduced flicker noise.

FIG. 9 shows an implementation of a mixer with reduced flicker noise. The implementation is based on a double balanced Gilbert cell topology. The mixer includes a first input 900 to input a high frequency signal (RF signal) and a second input 901 to input an inverse RF signal. The first input 900 couples to a first gate terminal 902 of a first transistor 903. The second input 901 couples to a second gate terminal 904 of a second transistor 905. A first source terminal 906 of the first transistor 903 and a second source terminal 907 of the second transistor 905 couple to a current source 908. A first drain terminal 909 couples to a first input knot 910. A second drain terminal 911 couples to a second input knot 912. The first transistor 903 forms an input amplifier to receive the RF signal at the first input and to provide an amplified RF signal at the first knot 910 of the mixing quad stage. The second transistor 905 forms an input amplifier to receive the inverse RF signal at the first input and to provide an amplified of the inverse RF signal at the second knot 912.

The mixer has a third input 913 to receive a local oscillator signal (LO signal). It further has a fourth input 914 to receive an inverse LO signal. The third input 913 couples to a third gate terminal 915 of a third transistor 916. It further couples to a fourth gate terminal 917 of a fourth transistor 918. The fourth input 914 couples to a fifth gate terminal 919 of a fifth transistor 920. It further couples to a sixth gate terminal 921 of a sixth transistor 922. A third source terminal 923 of the third transistor 916 and a fifth source terminal 924 of a fifth transistor 920 couple to the first knot 910. A sixth source terminal 925 of the sixth transistor 922 and a fourth source terminal 926 of a fourth transistor 918 couple to the second knot 912.

A third drain terminal 927 of the third transistor 916 and a sixth drain terminal 928 of a sixth transistor 922 couple to a third knot 929. A fourth drain terminal 930 of the fourth transistor 918 and a fifth drain terminal 931 of a fifth transistor 920 couple to a fourth knot 932. The third knot 929 couples via a first matching load 933 to a supply voltage terminal 934. It further couples to a first signal output 335. The fourth knot 932 couples via a second matching load 936 to the supply voltage terminal 934. It further couples to a second signal output 937.

A matching load may serve for impedance matching. Impedance matching is the practice of attempting to make the output impedance of a source equal to the input impedance of the load to which it is ultimately connected, usually in order to maximize the power transfer and minimize reflections from the load. The matching load may also serve to filter components of the LO signal and/or the RF signal. The matching load usually includes resistive, capacitive, and/or inductive elements.

The third transistor 916 and the fifth transistor 920 form a first differential pair of switching elements. The fourth transistor 918 and the sixth transistor 922 form a second differential pair of switching elements. The input LO signal 913 generates via transistors 916 and 918 a common mode signal at outputs 935 and 937 while the inverted LO signal 914 generates via transistors 920 and 922 an in inverted common mode signal at outputs 935 and 937. With respect to the RF signal at nodes 910 and 912, the switching pairs connect in parallel. Consequently, at the output, the LO signal is cancelled, while the output signal is doubled. This assures, that the doubled balance mixer provides a high level of isolation between the LO signal and the output signal.

The LO signal and the RF signal are mixed in the differential pair to produce an output signal. The third transistor 916, the fourth transistor 918, the fifth transistor 920, and the sixth transistor 922 are active elements that receive a switched bias signal in form of the LO signal or the inverse LO signal respectively. The named transistors have a bulk terminal each. A body-bias input 938 couples to all of the bulk terminals. The body-bias input 938 receives a forward back-bias signal, such as a forward back-bias current, a positive voltage, etc. The forward back-bias signal may be a constant or a switched signal.

Figure 10:
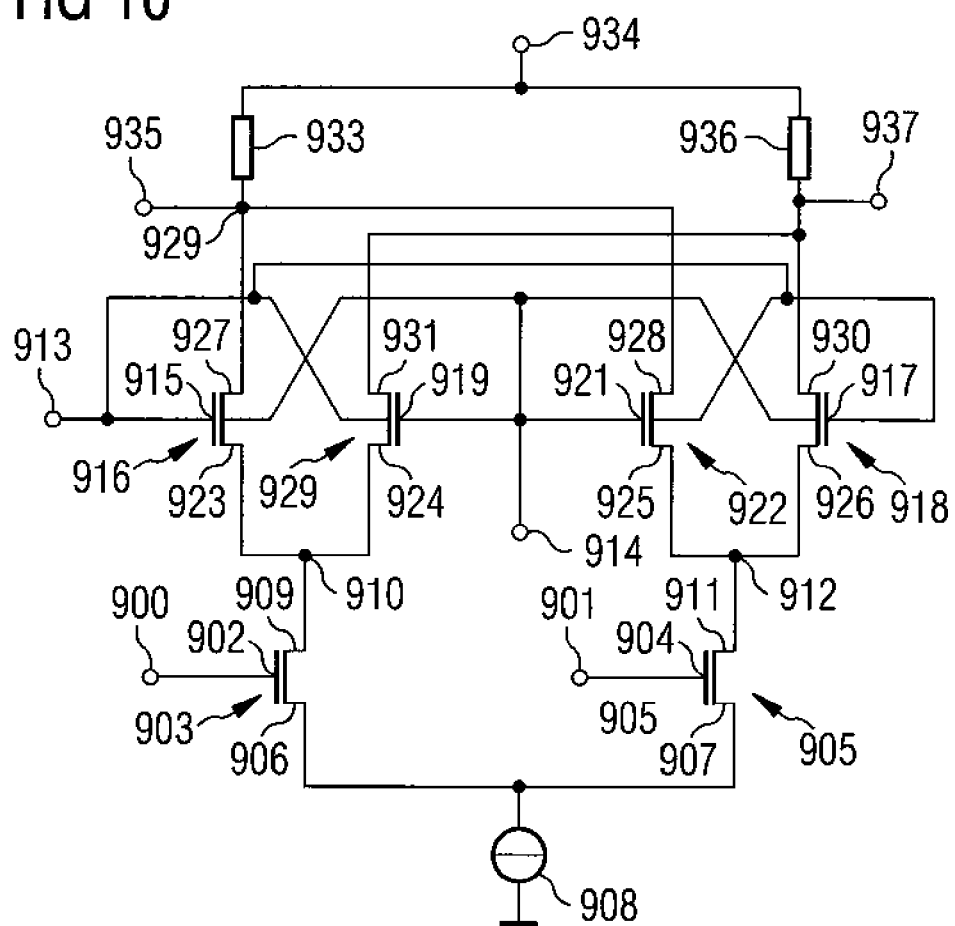
FIG. 10 shows a second implementation of a mixer with reduced flicker noise.
Figure 11A:
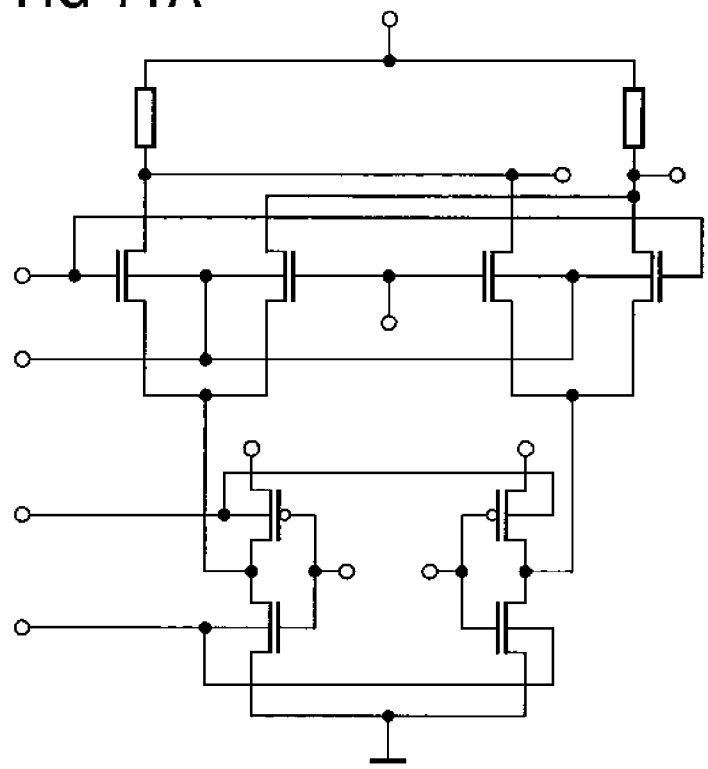
FIG. 11a to FIG. 11f show different implementations of a transconductance mixer with reduced flicker noise.
Figure 11B:
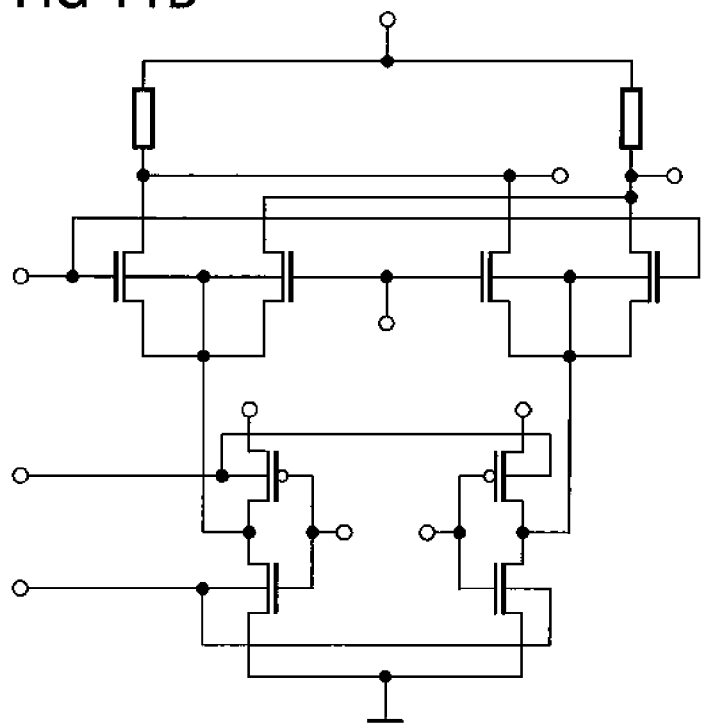
Figure 11C:
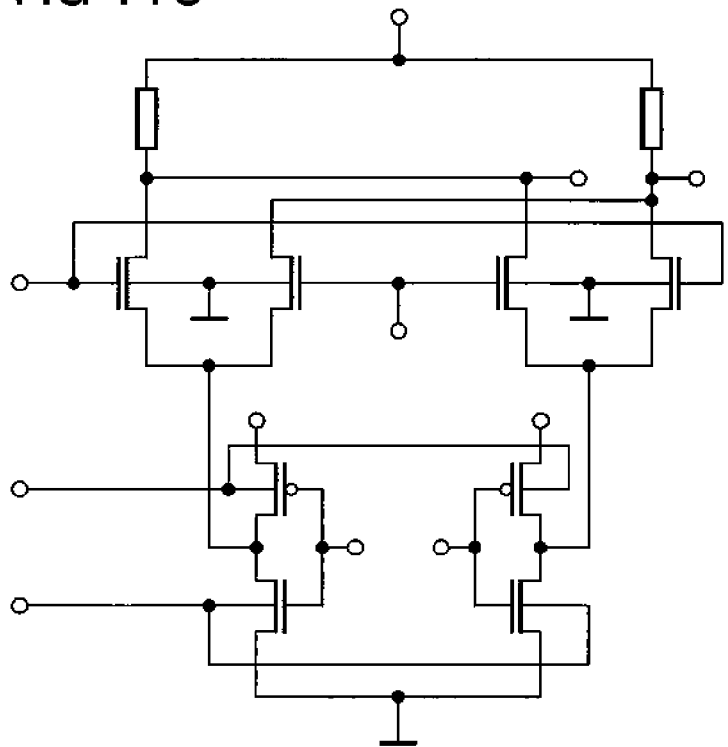
Figure 11D:
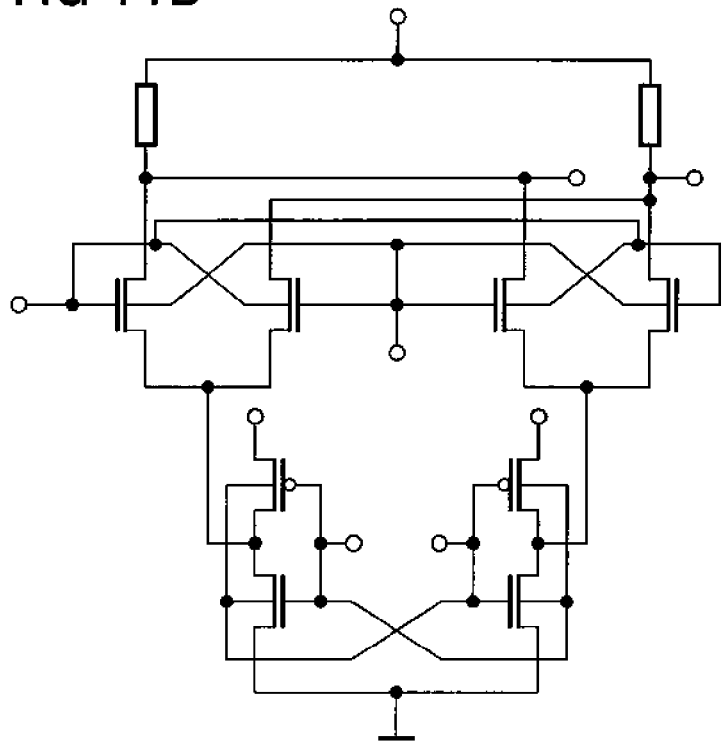
Figure 11E:
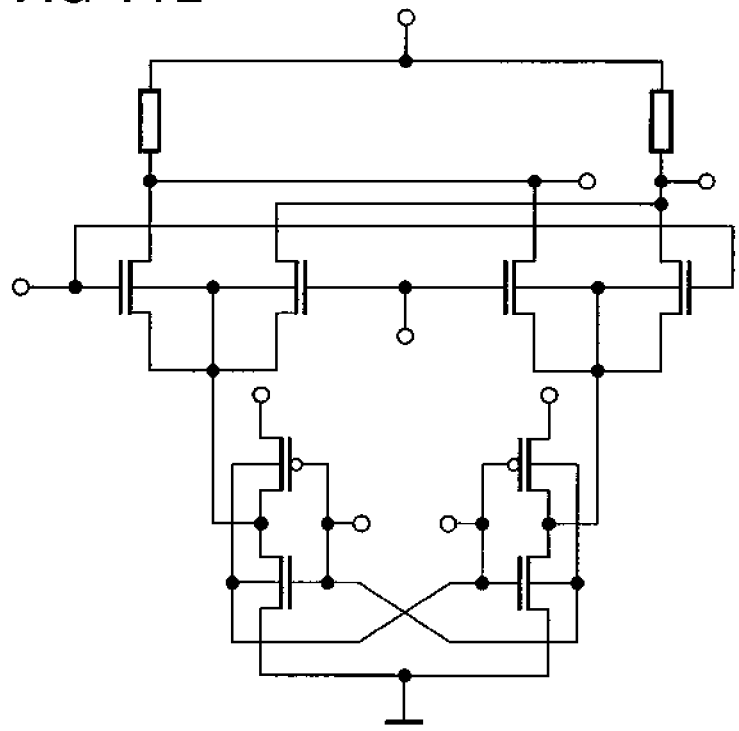
Figure 11F:
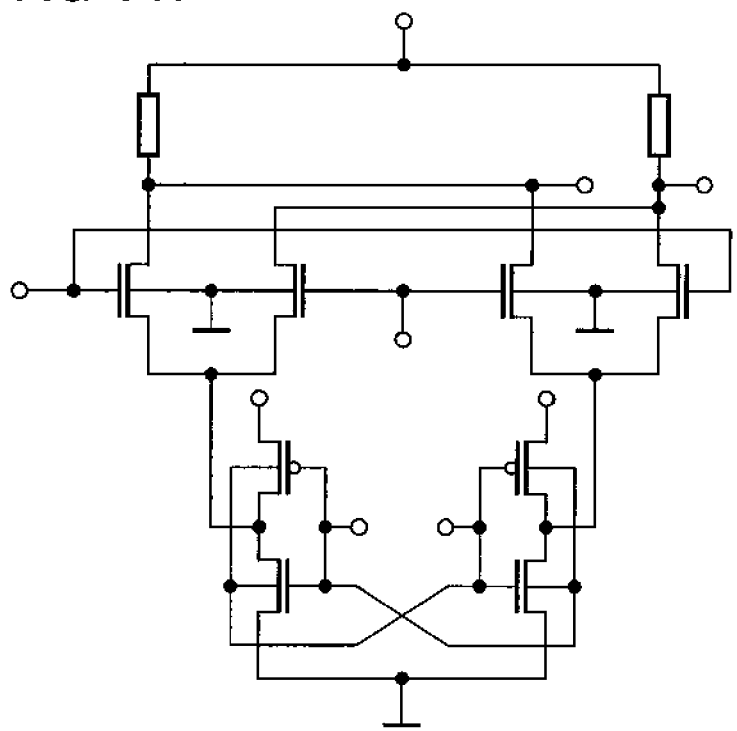

FIG. 10 shows a second implementation of a mixer with reduced flicker noise. In contrast to the first implementation of a mixer as shown in FIG. 9, FIG. 10 makes use of the described technique of a switched bias in combination with a back-bias pulsing. The architecture is changed in respect to the own shown in FIG. 9 by coupling the bulk terminal of the third transistor 916 and the bulk terminal of the fourth transistor 918 to the fourth input 914. The bulk terminals of the fifth transistor 922 and the sixth transistor 929 couple to the third input 913. The body-bias input is omitted.

In one embodiment of the mixer, the body-bias signal may be provided via a non inverting amplifier from the input signal at terminal 914 and the body-bias signals of transistors 929 and 922 via an non inverting amplifier from the input signal 913 to the respective bulk terminals of transistors 916 and 918.

In another embodiment of the mixer that provides the body-bias signals may be provided via a inverting amplifier from the input signal at terminal 913 and the body-bias signals of transistors 929 (920) and 922 via a inverting amplifier from the input signal at terminal 914 to the respective bulk terminals of transistors 916 and 918.

FIG. 11a to FIG. 11f show different implementations of a transconductance mixer with reduced flicker noise. In the different modification, the implementations of FIG. 11a, FIG. 11b, and FIG. 11c make use of a switching bias in combination with a constant forward body-biasing. The implementations of FIG. 11d, FIG. 11e, and FIG. 11f make use of a switched bias in combination with a back-bias pulsing.

All exemplary circuitry shown make use of the technique described with reference to the active device shown in FIG. 1. It is apparent to one skilled in the art, that the described technique may be applied to any mixer architecture, such as active or passive mixer. The architectures may make use of a single balanced or double balanced differential pair or a Gilbert cells. It may make use of nonlinear resistance, non-linear reactance, or non-linear transconductance architecture. The bulk of the input transistors may connect to their respective source terminal or to a ground terminal. A positive voltage may be applied to the bulk of the input transistors. The topology of the mixer may include PMOS transistors instead of NMOS transistors. In that case, the architecture is to be mirrored accordingly.

Exemplary Process

FIG. 12 shows an implementation of a process of signal processing with reduced flicker noise by an active device.

In a first step 1200 a switched bias signal is supplied to a control terminal of the active device. In a second step 1201 a forward body-bias signal is supplied to a bulk terminal of the active device. The sequence of the steps 1200 and 1201 is shown in an exemplary way and may be interchanged without any difference in effect. Usually, both steps 1200 and 1201 are performed simultaneously. The forward body-bias signal may be supplied as switched signal. It may be derived from the bias signal. In some embodiments of the process, the bias signal and the body-bias signal are asynchronously switched and/or out-of phase.

CONCLUSION

For the purpose of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is understood that the subject matter defined in the appended claims is not necessarily limited to the specific features or acts described. Rather, the specific features and acts are disclosed as preferred forms of implementing the claims.

What is claimed is:

1. An apparatus comprising:
   an active device structured in a semiconductor body comprising:
      a source region;
      a drain region;
      a body region including a channel region, the channel region located between the source region and the drain region;
      a gate terminal to receive an alternating bias signal,
      a bulk terminal coupled to the body region and configured to receive a forward body-bias signal,
      a first circuit portion coupled to the gate terminal to provide the alternating bias signal; and
      a second circuit portion coupled to the bulk terminal to provide the forward body-bias signal; and
      wherein the alternating bias signal and the body-bias signal are configured to reduce flicker noise of the apparatus.

2. An apparatus according to claim 1, wherein the duty cycle of the alternating bias signal has a duty cycle different from 50%.

3. The apparatus according to claim 1, wherein the body-bias signal is a switched signal and the alternating bias signal and the body-bias signal are out of phase.

4. An apparatus according to claim 3, wherein the alternating bias signal and the forward body-bias signal are phase-shifted to each other by 180°.

5. An apparatus according to claim 3, wherein the alternating bias signal and the forward body-bias signal are asynchronous to each other.

6. An apparatus according to claim 3, wherein the duty cycle of the forward body-bias signal has a duty cycle different from 50%.

7. The apparatus according to claim 3, wherein the body-bias signal is derived from the bias signal.

8. Semiconductor circuitry for reduced flicker noise processing of a frequency signal, comprising:
   a field effect transistor comprising:
      a source region;
      a drain region;
      a body region including a channel region, the channel region located between the source region and the drain region;
      a gate terminal to receive an alternating bias signal,
      a bulk terminal coupled to the body region and configured to receive a forward body-bias signal,
   a first circuit portion to provide the alternating bias signal,
   a second circuit portion to provide the forward back-bias signal, the forward back-bias signal being a voltage between the bulk terminal and the source terminal; and
   wherein the alternating bias signal and the body-bias signal are configured to reduce flicker noise of the apparatus.

9. A semiconductor circuitry according to claim 8 comprising:
   a nonlinear circuit portion incorporating the field effect transistor.

10. A semiconductor circuitry according to claim 9, wherein the nonlinear circuit portion comprises at least one of:
    an oscillator circuitry, or
    a mixer circuitry.

11. A semiconductor circuitry according to claim 8, comprising:
    a current source incorporating the field effect transistor.

12. A semiconductor circuitry according to claim 8, wherein the forward back-bias signal provides an alternating bias.

13. The semiconductor circuitry according to claim 12, wherein the forward back-bias signal is derived from the alternating bias signal, and the alternating bias signal being out of phase to the forward body-bias signal.

14. The semiconductor circuitry according to claim 8, wherein the second circuit portion is disposed to provide the forward back-bias signal whenever the field effect transistor is in an off state in circuitry operation.

15. A method for operating an active device with less flicker noise, the method comprising:
    supplying an alternating bias signal to a gate terminal of the active device;
    supplying a forward body-bias signal to a bulk terminal of the active device, the bulk terminal coupled to a body region of the active device that includes a channel region of the active device; and
    reducing flicker noise of the active device using the alternating bias signal and the forward body-bias signal.

16. A method according to claim 15, wherein supplying the forward body-bias signal includes supplying an alternating forward body-bias signal.

17. A method according to claim 16, wherein the alternating bias signal and the alternating forward body-bias signal are phase-shifted to each other by 180°.

18. A method according to claim 16, wherein the alternating bias signal and the alternating forward body-bias signal are asynchronous to each other.

19. A method according to claim 15, wherein the duty cycle of the alternating bias signal has a duty cycle different from 50%.

20. A method according to claim 16, wherein the duty cycle of the alternating forward body-bias signal has a duty cycle different from 50%.

21. A method according to claim 15, wherein the forward body-bias signal provides a constant bias.

22. The method according to claim 16, wherein the supplying the alternating forward body-bias signal includes deriving the alternating forward body-bias signal from the alternating bias signal.

23. The semiconductor circuitry according to claim 15, providing the forward back-bias signal to the bulk terminal whenever the active device is in an off state.

* * * * *